United States Patent
Ishibashi et al.

(10) Patent No.: US 11,831,337 B2
(45) Date of Patent: Nov. 28, 2023

(54) SEMICONDUCTOR DEVICE AND ERROR DETECTION METHODS

(71) Applicant: RENESAS ELECTRONICS CORPORATION, Tokyo (JP)

(72) Inventors: Takashi Ishibashi, Tokyo (JP); Hiroyuki Hashimoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/738,542

(22) Filed: May 6, 2022

(65) Prior Publication Data

US 2022/0416813 A1    Dec. 29, 2022

(30) Foreign Application Priority Data

Jun. 29, 2021 (JP) .................. 2021-108192

(51) Int. Cl.
*H03M 13/00* (2006.01)
*H03M 13/15* (2006.01)

(52) U.S. Cl.
CPC ................. *H03M 13/159* (2013.01)

(58) Field of Classification Search
CPC .. H03M 13/151; H03M 13/19; H03M 13/251; H03M 13/159; H03M 13/1545; H03M 13/1515; H03M 13/154
See application file for complete search history.

(56) References Cited

U.S. PATENT DOCUMENTS

| | | | | |
|---|---|---|---|---|
| 4,523,314 A * | 6/1985 | Burns | ..................... | G11C 29/00 |
| | | | | 714/E11.041 |
| 5,745,508 A * | 4/1998 | Prohofsky | ........... | G06F 11/1028 |
| | | | | 714/766 |
| 7,653,862 B2 * | 1/2010 | Hassner | ................ | H03M 13/19 |
| | | | | 714/767 |
| 9,800,271 B2 * | 10/2017 | Jung | .................. | H03M 13/6502 |
| 9,805,827 B2 * | 10/2017 | Son | ...................... | G11C 11/4096 |
| 10,263,645 B2 * | 4/2019 | Jung | .................... | H03M 13/152 |
| 10,735,028 B2 | 8/2020 | Tsuboi | | |
| 10,761,927 B2 * | 9/2020 | Lu | ......................... | H03M 13/05 |
| 10,802,912 B2 * | 10/2020 | Cha | ..................... | G06F 11/1068 |
| 11,104,653 B2 * | 8/2021 | Miyake | ................ | C07D 239/26 |
| 11,194,653 B2 * | 12/2021 | Ryu | ....................... | G06F 11/108 |
| 11,200,117 B2 * | 12/2021 | Lee | ..................... | G06F 11/1068 |
| 2020/0371864 A1 * | 11/2020 | Kern | ................. | H03M 13/1174 |

FOREIGN PATENT DOCUMENTS

JP    2019-109806 A    7/2019

OTHER PUBLICATIONS

M. Y. Hsiao, "A Class of Optimal Minimum Odd-weight-col. SECDED Codes", IBM Journal of Research and Development, vol. 14, Issue 4, published by IBM, Jul. 1970.

* cited by examiner

*Primary Examiner* — Esaw T Abraham
(74) *Attorney, Agent, or Firm* — McDermott Will & Emery LLP

(57) ABSTRACT

A semiconductor device includes a syndrome generation circuit configured to generate a syndrome code based on data and an error correction code corresponding to the data, an error determination circuit configured to detect a 1-bit error in the data based on the syndrome code, and multi-bit error detection circuit configured to determine whether the data detected to have 1-bit error includes a multi-bit error by using an error address of the data detected to have 1-bit error and an error syndrome code of the data detected to have 1-bit error.

15 Claims, 6 Drawing Sheets

SEMICONDUCTOR DEVICE AND ERROR DETECTION METHODS

CROSS-REFERENCE TO RELATED APPLICATIONS

The disclosure of Japanese Patent Application No. 2021-108192 filed on Jun. 29, 2021, including the specification, drawings and abstract is incorporated herein by reference in its entirety.

BACKGROUND

The present disclosure relates to a semiconductor device, and for example, to a semiconductor device having error detection circuit that detects multi-bit errors in memory.

THE BACKGROUND OF THE INVENTION

One of the error correction codes (Error Correction Code: ECC) is 1-bit error correction and 2-bit error detection code (Single Error Correction-Double Error Detection Code: SEC-DED Code). There are disclosed techniques listed below.

[Non-Patent Document 1] M. Y. Hsiao, "A Class of Optimal Minimum Odd-weight-column SECDED Codes", IBM Journal of Research and Development, Volume 14, Issue 4, published by IBM, July 1970

Even if such an ECC is used, it is known that not all even-numbered bit errors of 4 bits or more can be detected, and that an odd-numbered bit error of 3 bits or more may be erroneously recognized as a 1-bit error and a normal bit may be erroneously corrected (Non-Patent Document 1).

On the other hand, Japanese unexamined Patent Application publication No. 2019-109806 (Patent Document 1) discloses a technique of increasing the detection probability of a multi-bit error by providing an encoder unit for generating two sets of ECCs.

When an error detection and correction circuit by ECC capable of 1-bit error correction and 2-bit error detection is used for a device requiring functional safety, etc., it is necessary to detect that the error is not errors of 3 bits or more (multi-bit error) when a 1-bit error is detected. Here, a device requiring functional safety support is, for example, a device requiring functional safety standard, such as a ISO26262.

SUMMARY

In the technique disclosed in Patent Document 1, a multi-bit error cannot be detected in some cases. Thus, from a functional safety point of view, each time an error is detected, a software diagnosis is necessary. Each time an address of data containing a 1-bit error is repeatedly accessed, a software diagnosis is required. As a result, the load by the software diagnosis increases.

Other objects and novel features will become apparent from the description of this specification and the accompanying drawings.

A semiconductor device according to one aspect of the present invention includes a syndrome generation circuit configured to generate a syndrome code based on data and an error correction code corresponding to the data, an error determination circuit configured to detect a 1-bit error in the data based on the syndrome code, and multi-bit error detection circuit configured to determine whether the data detected to have 1-bit error includes a multi-bit error by using an error address of the data detected to have 1-bit error and an error syndrome code of the data detected to have 1-bit error.

According to the semiconductor device, it is possible to reduce the load by software diagnosis.

DETAILED DESCRIPTION

Figure 1:
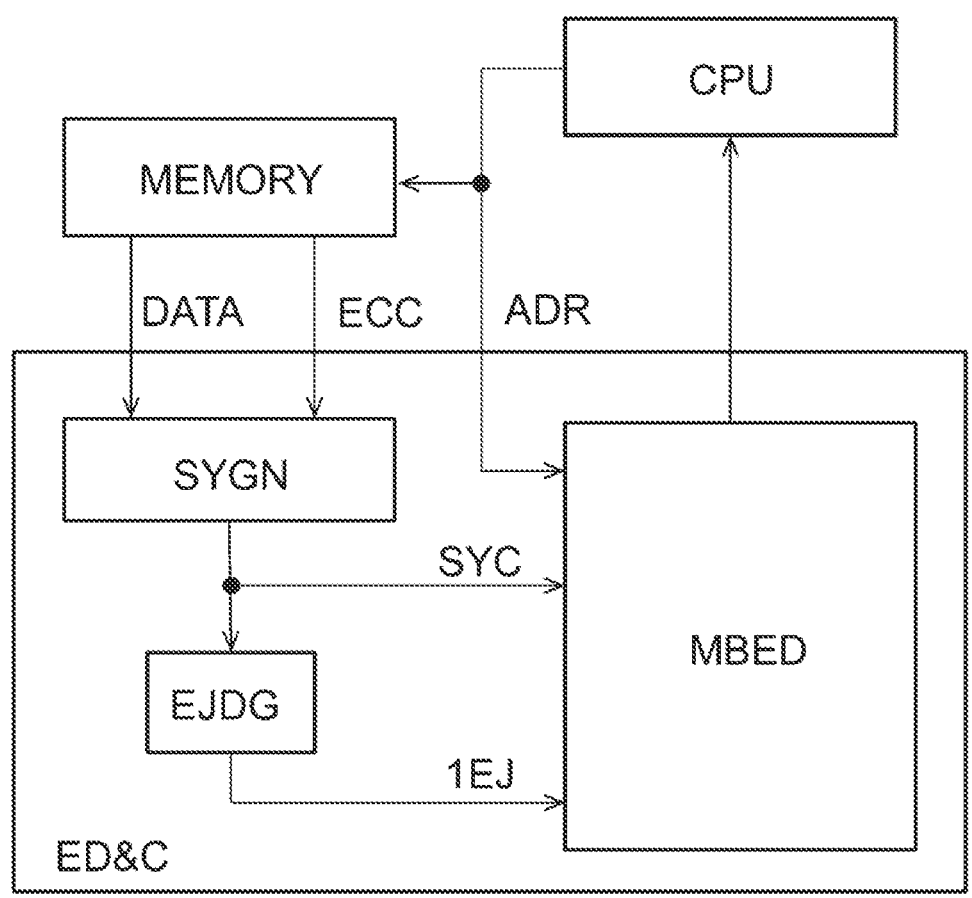
FIG. 1 is a block diagram showing a configuration of a semiconductor device in the embodiment.

Embodiments and modified example will be described below with reference to the drawings. However, in the following description, the same components are denoted by the same reference numerals, and a repetitive description thereof may be omitted.

As described above, when an ECC error detection and correction circuit which is configured to correct 1-bit error correction and detect 2-bit error is used in a device that requires functional safety support, it is necessary to check that the detected 1-bit error is not an error of 3 bits or more. Prior to this disclosure, the present disclosures have contemplated diagnosing a true 1-bit error by software. However, when the address of the data including the 1-bit error is repeatedly accessed to read the data, the software diagnosis is required each time, and the load by the software diagnosis increases.

An embodiment for solving the above problem will be described with reference to FIG. 1. FIG. 1 is a block diagram showing a configuration of a semiconductor device in the embodiment.

The error detection and correction circuit (ED&C) in a semiconductor device according to the embodiment includes a syndrome generation circuit (SYGN), an error determination circuit (EJDG), and a multi-bit error detection circuit (MBED). Here, the syndrome generation circuit (SYGN) generates a syndrome code (SYC) based on the data read from in the memory and the ECC added to the data. The ECC may be a code capable of 1-bit error correction, or may be a code capable of 1-bit error correction and 2-bit error detection. The error determination circuit (EJDG) determines a 1-bit error by using the syndrome code (SYC), and outputs a 1-bit error determination signal (1EJ) indicating that 1-bit error has been detected. The multi-bit error detection circuit (MBED) determines whether or not the bit error is detected as a 1-bit error in spite of a multi-bit error, on the basis of the 1-bit error determination signal (1EJ), the address (ADR) of the data in which the bit error is detected, and the syndrome code (SYC) when the error is detected.

When a 1-bit error is detected for the first time at the corresponding address, the multi-bit error detection circuit (MBED) notifies CPU (Central Processing Unit) of the detection. This is for the CPU to diagnose whether a multi-bit error is erroneously detected as the 1-bit error by using software. When the data including the 1-bit error is repeatedly read from the memory, the multi-bit error detection circuit (MBED) checks whether the syndrome code of the first read and the current syndrome code coincide with each other in the second and subsequent reads. If the syndrome codes do not coincide, the multi-bit error detection circuit (MBED) notifies the CPU that the detection result as 1-bit error is really a multi-bit error. When the syndrome codes coincide with each other, the multi-bit error detection circuit (MBED) does not notify the CPU that the detection result as 1-bit error.

Figure 2:
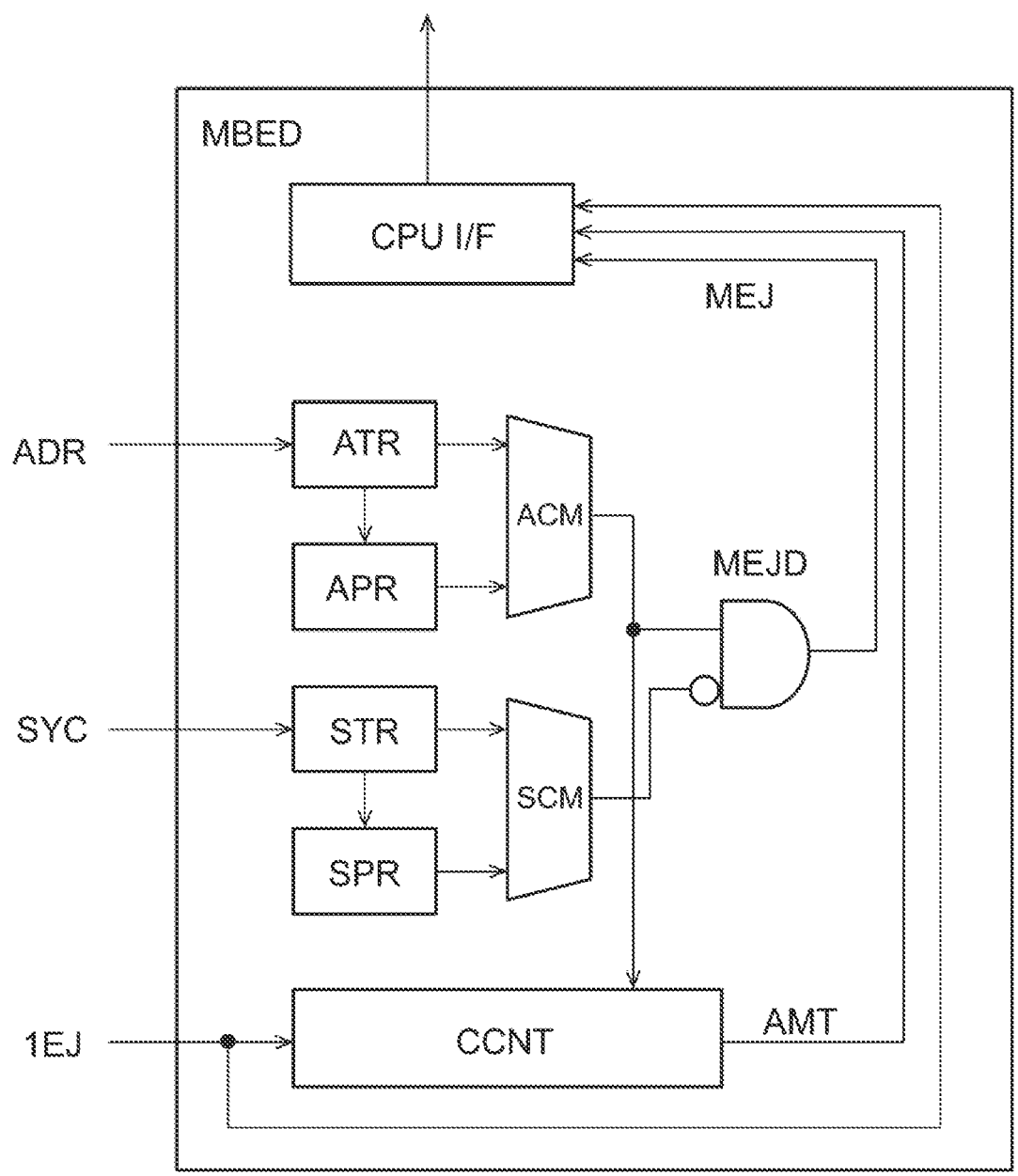
FIG. 2 is a block diagram showing an example of a configuration of a multi-bit error detection circuit shown in FIG. 1.

Next, the multi-bit error detection circuit (MBED) will be described with reference to FIG. 2. FIG. 2 is a block diagram showing an example of a configuration of the multi-bit error detection circuit shown in FIG. 1.

The multi-bit error detection circuit (MBED) has a first address register (ATR) and a second address register (APR). The first address register (ATR) is configured to capture the address (ADR) of data when the bit error is detected. The multi-bit error detection circuit (MBED) further includes a first syndrome code register (STR) and a second syndrome code register (SPR). The first syndrome code register (STR) is configured to capture a syndrome code (SYC) in which a bit error has been detected.

The multi-bit error detection circuit (MBED) further includes an address comparison circuit (ACM) for comparing value of the first address register (ATR) and value of the second address register (APR). The multi-bit error detection circuit (MBED) further includes a syndrome comparison circuit (SCM) for comparing value of the first syndrome code register (STR) and value of the second syndrome code register (SPR).

The multi-bit error detection circuit (MBED) has a multi-bit error judgement circuit (MEJD) that judges whether the value of the first address register (ATR) when 1-bit error is detected and the value of the second address register (APR) match and whether the values of the first syndrome code register (STR) and the second syndrome code register (SPR) do not match.

The multi-bit error detection circuit (MBED) includes a control circuit (CCNT) for controlling the first address register (ATR), the second address register (APR), the first syndrome code register (STR), and the second syndrome code register (SPR).

Furthermore, the multi-bit error detection circuit (MBED) includes a CPU interface circuit (CPU I/F) that notifies the CPU of 1-bit and multi-bit error information. The CPU interface circuit (CPU I/F) receives address match information (AMT) from the control circuit (CCNT), multi-bit error information (MEJ) from the multi-bit error judgement circuit (MEJD), and information (1EJ) indicating that a 1-bit error has been detected.

In the embodiment, only when a 1-bit error is detected for the first time at the corresponding address, CPU diagnoses whether the detection result as 1-bit error is really a multi-bit error by using software. However, when the data including the 1-bit error is repeatedly read from the memory, at the time of the second and subsequent reads, it is checked that the syndrome code at the time of the first read matches the current syndrome code. Thus, it is not necessary to perform the software diagnosis at the time of the second and subsequent reads. As a result, it is possible to reduce the load of the CPU by the software.

Further, in the embodiment, as in Patent Document 1, there is no need to have two sets of ECCs, so that a multi-bit error can be reliably detected. As the two sets of ECCs is not necessary, it is not necessary to make the memory capacity large.

In addition, according to the embodiment, the 2-bit error detection function as in Patent Document 1 can be performed, 2-bit error detection means as shown in Patent Document 1 becomes unnecessary. As a result, the memory capacity can be reduced by reducing the number of ECC bits.

First Embodiment

Figure 3:
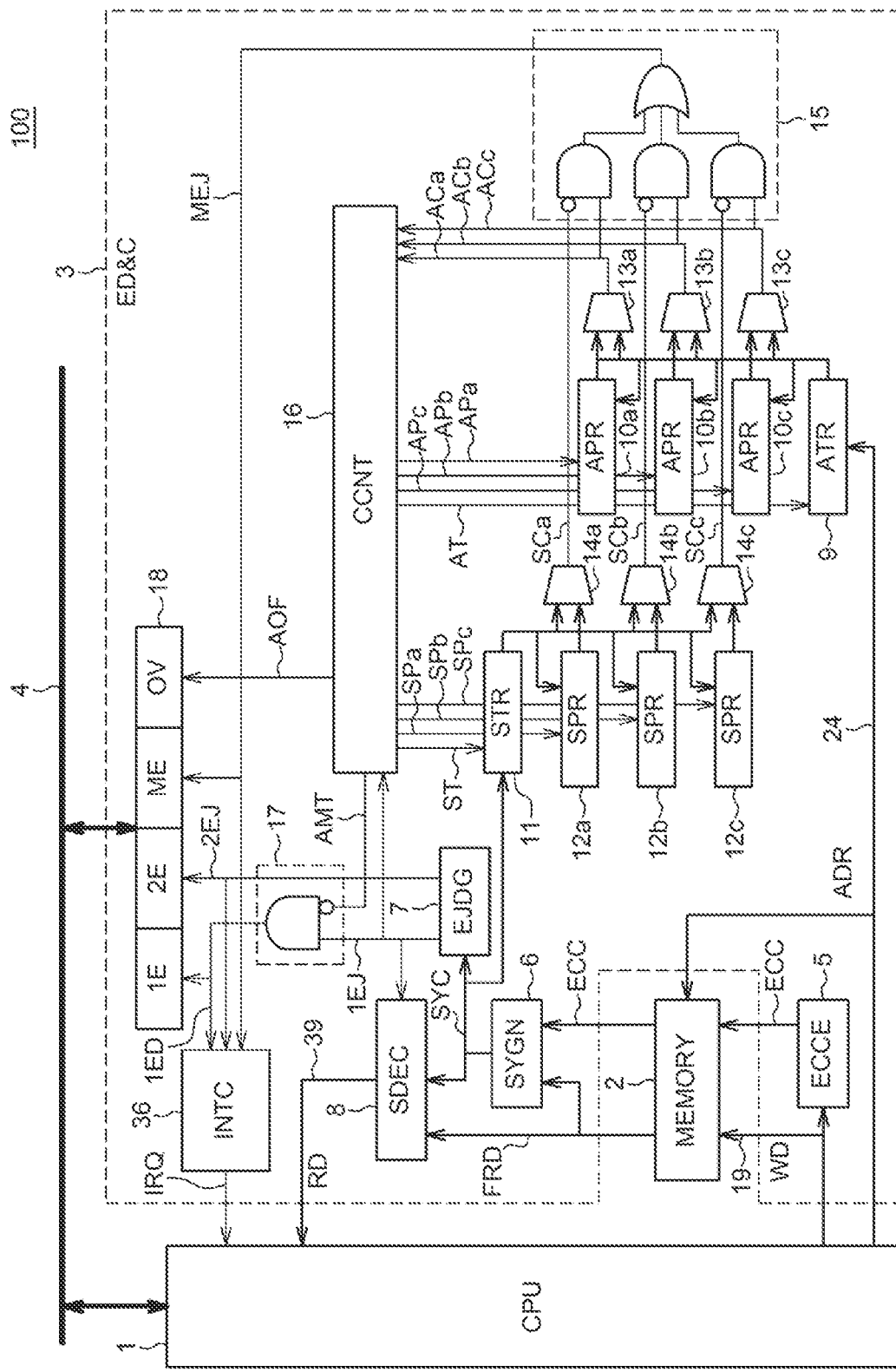
FIG. 3 is a block diagram showing a configuration example of a semiconductor device in the first embodiment.

FIG. 3 is a block diagram showing a configuration example of a semiconductor device in the first embodiment.

The semiconductor device 100 includes CPU 1, a memory 2, an error detection and correction circuit (ED&C) 3, and an internal bus 4. The semiconductor device 100, for example, configured as a microcontroller, is formed in one semiconductor chip. The memory 2 is, for example, a flash memory. The memory 2 stores programs executed by CPU 1 and data handled by the programs. CPU 1, the memory 2 and the error detection and correction circuit 3 may be formed on different chips. Alternatively, CPU 1 and the error detection and correction circuit (ED&C) 3 may be formed in the same semiconductor chip, and the memory 2 may be formed in another semiconductor chip. The memory 2 and the error detection and correction circuit (ED&C) 3 may be formed in the same semiconductor chip, and CPU 1 may be formed in another semiconductor chip.

The error detection and correction circuit (ED&C) 3 includes an ECC encoder (ECCE) 5, a syndrome generation circuit (SYGN) 6, an error determination circuit (EJDG) 7, and an error correction circuit (SDEC) 8.

The error detection and correction circuit (ED&C) 3 includes a first address register (ATR) 9, three second address registers (APR) 10a, 10b, and 10c, and three address comparison circuits (ACM) 13a, 13b, and 13c. The error detection and correction circuit (ED&C) 3 further includes a first syndrome code register (STR) 11, three second syndrome registers (SPRs) 12a, 12b, and 12c, and three syndrome comparison circuits (SCM) 14a, 14b, and 14c. The error detection and correction circuit (ED&C) 3 further includes a multi-bit error judgement circuit (MEJD) 15 and a control circuit (CCNT) 16.

The error detection and correction circuit (ED&C) 3 further includes an error flag mask circuit 17, an error flag register 18, and an interrupt control circuit (INTC) 36. The error flag mask circuit 17, the error flag register 18, and the interrupt control circuit (INTC) 36 constitute a CPU interface circuit (CPU I/F) in the embodiment.

The ECC encoder (ECCE) 5 generates an ECC capable of 1-bit error correction and 2-bit error detection based on write data (WD) written into the memory 2 from CPU 1 or the outside of the semiconductor device 100. For example, when the write data WD is 32 bits, the ECC is 7 bits. The ECC encoder (ECCE) 5 outputs the generated ECC to the memory 2. The write data (WD) transferred via the write data bus 19 and ECC outputted from the ECC encoder (ECCE) 5 are stored in the memory 2.

The syndrome generation circuit (SYGN) 6 generates a syndrome code (SYC) based on the data (FRD) and the ECC read from the memory 2. The syndrome generation circuit (SYGN) 6 generates a 7-bit syndrome code (SYC) from 32-bit data (FRD) and 7-bit ECC, for example. The syndrome generation circuit (SYGN) 6 outputs the generated syndrome code (SYC) to the error determination circuit (EJDG) 7, the error correction circuit (SDEC) 8 and the first syndrome code register (STR) 11.

The error determination circuit (EJDG) 7 generates a 1-bit error determination signal (1EJ) and a 2-bit error determination signal (2EJ) based on the syndrome code (SYC). When detecting a 1-bit error, the error determination circuit (EJDG) 7 activates the 1-bit error determination signal (1EJ) and outputs it to the control circuit (CCNT) 16 and the error flag mask circuit 17. When detecting a 2-bit error, the error determination circuit (EJDG) 7 activates a 2-bit error determination signal (2EJ) and outputs it to the error flag register 18.

The error correction circuit (SDEC) 8 receives the data (FRD), the syndrome code (SYC), and the 1-bit error determination signal (1EJ). Then, the error correction circuit (SDEC) 8 outputs the read data (RD) to CPU 1 via the read data bus 39. When a 1-bit error is detected, the error correction circuit (SDEC) 8 corrects the error in the data (FRD) and outputs the corrected data as read data (RD). When a 1-bit error is not detected, the error correction circuit (SDEC) 8 outputs data (FRD) as read data (RD).

The control circuit (CCNT) 16 receives the 1-bit error determination signal (1EJ) and the address comparison signals (ACa, ACb, ACc) which are output from the address comparison circuits (ACM) 13a, 13b and 13c. The control circuit (CCNT) 16 outputs the first address control signal (AT) to the first address register (ATR) 9, and outputs the second address control signals (APa, APb, APc) to the second address registers (APR) 10a, 10b and 10c. The control circuit (CCNT) 16 outputs the first syndrome control signal (ST) to the first syndrome code register (STR) 11, and outputs the second syndrome control signals (SPa, SPb, SPc) to the second syndrome registers (SPR) 12a, 12b, and 12c. The control circuit (CCNT) 16 performs the logical OR operation of the address comparison signals (ACa,ACb, ACc), and outputs the logical OR result to the error flag mask circuit 17 as an address match signal (AMT).

The address comparison circuits (ACM) 13a, 13b, and 13c compare the address stored in the first address register (ATR) 9 and addresses stored in the second address registers (APR) 10a, 10b, and 10c, respectively. Then, the address comparison circuits (ACM) 13a, 13b, 13c output the address comparison signals (ACa, ACb, ACc) to the control circuit (CCNT) 16 and the multi-bit error judgement circuit (MEJD) 15. When the address stored in the first address register (ATR) 9 matches any one of the addresses stored in the second address registers (APR) 10a, 10b, and 10c, the address comparison circuits (ACM) 13a, 13b, and 13c activate corresponding address comparison signals (ACa, ACb,ACc).

The syndrome comparison circuits (SCM) 14a, 14b, and 14c compare the syndrome code stored in the first syndrome code register (STR) 11 with the syndrome codes stored in the second syndrome registers (SPR) 12a, 12b, and 12c. Then, the syndrome comparison circuits (SCM) 14a, 14b, and 14c output syndrome comparison signals (SCa,SCb,SCc) to the multi-bit error judgement circuit 15. When the syndrome code of the first syndrome code register (STR) 11 matches any of the syndrome codes of the second syndrome registers (SPR) 12a, 12b, and 12c, the syndrome comparison circuits (SCM) 14a, 14b, and 14c activate the corresponding syndrome comparison signals (SCa,SCb,SCc).

The multi-bit error judgement circuit (MEJD) 15 generates a multi-bit error determination signal (MEJ) based on the address comparison signals (ACa,ACb,ACc) and the syndrome comparison signals (SCa,SCb,SCc). The multi-bit error determination signal (MEJ) is output to the error flag register 18 and the interrupt control circuit (INTC) 36. When any one of the address comparative signals (ACa,ACb,ACc) is active and all of the syndrome compare signals (SCa,SCb, SCc) are inactive, the multi-bit error judgement circuit (MEJD) 15 activates the multi-bit error determination signal (MEJ).

The error flag mask circuit 17 generates a 1-bit error decision signal (1ED) based on the 1-bit error determination signal (1EJ) and the address match signal (AMT). When the 1-bit error determination signal (1EJ) is active and the address match signal (AMT) is inactive, the error flag mask circuit 17 activates the 1-bit error decision signal (1ED).

To the error flag register 18, the 1-bit error decision signal (1ED), the 2-bit error determination signal (2EJ), a multi-bit error determination signal (MEJ) and an address overflow signal (AOF) are input. When the 1-bit error decision signal (1ED) is active, the 1-bit error flag (1E) is set. When the 2-bit error determination signal (2EJ) is active, the 2-bit error flag (2E) is set. When the multi-bit error determination signal (MEJ) is active, the multi-bit error flag (ME) is set. When the address overflow signal (AOF) is active, the overflow flag (OV) is set.

The interrupt control circuit (INTC) 36 generates an interrupt signal (IRQ) based on the 1-bit error decision signal (1ED), the 2-bit error determination signal (2EJ), and the multi-bit error determination signal (MEJ), and outputs the generated the interrupt signal (IRQ) to CPU 1. The interrupt control circuit (INTC) 36 activates the interrupt signal (IRQ) when the 1-bit error decision signal (1ED), the 2-bit error determination signal (2EJ), or the multi-bit error determination signal (MEJ) is active.

Figure 4:
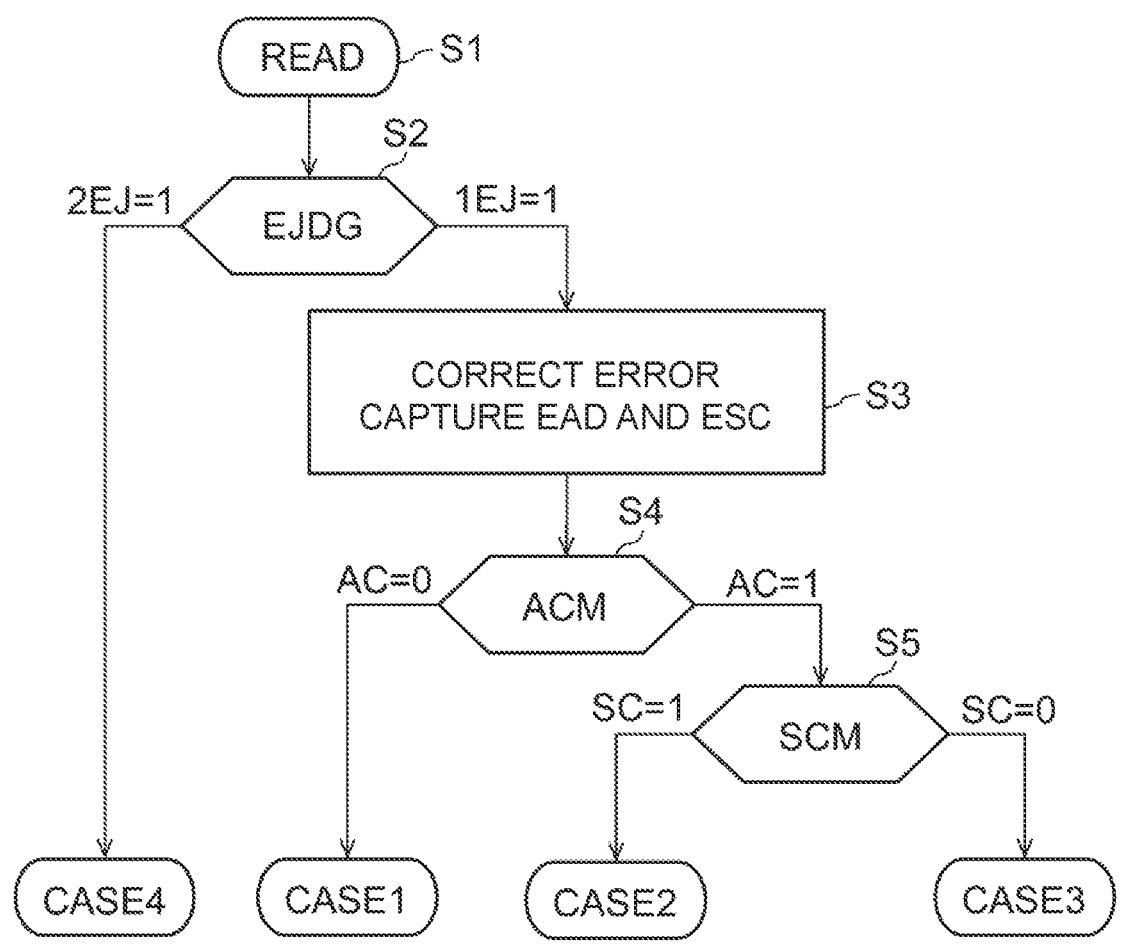
FIG. 4 is a diagram for explaining the case of detecting an error in reading from a memory.

Next, the operation of the semiconductor device 100 will be described with reference to FIGS. 3 and 4. FIG. 4 is a diagram for explaining the case of detecting an error in reading from a memory.

The memory 2 stores a program executed by CPU 1. The ECC encoder (ECCE) 5 generates an ECC based on program data provided from the outside of the semiconductor device 100. The program data is written to the memory 2 together with the ECC.

CPU 1 send an address (ADR) to the memory 2 via the address bus 24 to instructs the memory 2 to read the data corresponding to the address (ADR) (step S1).

The memory 2 reads out the read data (FRD) and ECC corresponding to the read data (FRD) based on the addresses (ADRs), and sends the read data (FRD) and ECC to the syndrome generation circuit (SYGN) 6. The error determination circuit (EJDG) 7 performs an error determination operation based on the syndrome code (SYC) generated by the syndrome generation circuit (SYGN) 6 (step S2). When the error determination circuit (EJDG) 7 detects a 1-bit error, the error determination circuit (EJDG) 7 activates the 1-bit error determination signal (1EJ=1).

When the error determination circuit (EJDG) 7 detects a 1-bit error, the error correction circuit (SDEC) 8 and the control circuit (CCNT) 16 perform the following step (step S3).

The error correction circuit (SDEC) 8 decodes the syndrome code (SYC) to find the bit position of the 1-bit error. Then, the error correction circuit (SDEC) 8 receives the active 1-bit error determination signal (1EJ), and corrects the read data (FRD) by inverting the data of the error bit on the basis of the bit position of the 1-bit error.

The control circuit (CCNT) 16 receives the 1-bit error determination signal (1EJ), and controls the first address register (ATR) 9 to capture the address of the data in which the bit error is detected from the address bus 24. In parallel, the control circuit (CCNT) 16 controls the first syndrome code register (STR) 11 to capture the syndrome code of the data in which the bit error is detected from the syndrome generation circuit (SYGN) 6. Hereinafter, the address of the data where the bit error is detected is referred to as "error address (EAD)". Hereinafter, the syndrome code of the data in which the bit error is detected is referred to as "error syndrome code (ESC)".

The address comparison circuits (ACM) 13a, 13b, 13c compare the address captured in the first address register (ATR) 9 and the second address registers (APR) 10a, 10b, 10c, respectively (step S4). The second address registers (APR) 10a, 10b, 10c stores an address corresponding to the data in which a 1-bit error has been detected in the past. Accordingly, by the address comparison, it is determined whether or not the address captured in the first address register (ATR) 9 is an address corresponding to the data in which a 1-bit data error has already been detected. When the address captured in the first address register (ATR) 9 does not match any address of the second address registers (APR) 10a, 10b, 10c (AC=0), the operation of case 1 is performed.

Incidentally, if the error address is not yet captured in the first address register (ATR), the addresses other than the address space of the memory 2 is set in the second address register (APR) 10a, 10b, 10c.

(1) Case 1

Case 1 is when the 1-bit error in the data corresponding to the address sent from CPU 1 is detected for the first time. Hereinafter, the operation of the case 1 will be described.

(1-1) Operation of the Error Detection and Correction Circuit (ED&C) 3.

The address comparison circuits (ACM) 13a, 13b, 13c send the address comparison signals (ACa,ACb,ACc) which are their comparison results to the control circuit (CCNT) 16, respectively. In case 1, the address of the first address register (ATR) 9 corresponds to the address of the data in which a 1-bit error is detected for the first time. Therefore, the address comparison signals (ACa,ACb,ACc) indicate that the address of the first address register (ATR) 9 does not match any addresses of the second address registers (APR) 10a, 10b, 10c. The control circuit (CCNT) 16 controls the address captured by the first address register (ATR) 9 to be copied to any one of the second address registers (APR) 10a, 10b, and 10c based on the address comparison signals (ACa,ACb,ACc). The control circuit (CCNT) 16 holds information indicating which of the second address register (APR) 10a, 10b, and 10c has already captured an error address (EAD). The control circuit (CCNT) 16 controls to copy the error address of the first address register (ATR) 9 to a register that has not capture the error address (EAD) among the second address registers (APR) 10a, 10b, and 10c.

In the present embodiment, the control circuit (CCNT) 16 controls the second address registers (APR) 10a, 10b, and 10c to capture the error address (EAD) in this order.

When the error address (EAD) have not been captured in any of the second address registers (APR) 10a, 10b, 10c, the control circuit (CCNT) 16 activates the second address control signal (APa) and controls to copy the address of the first address register (ATR) 9 to the second address register (APR) 10a. The control circuit (CCNT) 16 activates the second syndrome control signal (SPa) with the selection of the second address register (APR) 10a. The error syndrome code (ESC) stored in the first syndrome code register (STR) 11 is copied to the second syndrome code register (SPR) 12a. Thus, the error address (EAD) is stored in the second address register (APR) 10a, the error syndrome code (ESC) is stored in the second syndrome code register (SPR) 12a.

If the second address registers (APR) 10a, 10b has captured another error address (EAD), the control circuit (CCNT) 16 activates the second address control signal (APc) and controls to copy the address of the first address register (ATR) 9 to the second address register (APR) 10c. In this instance, the control circuit (CCNT) 16 activates the second syndrome control signal (SPc) with the selection of the second address register (APR) 10c and control to copy the content of the first syndrome code register (STR) 11 to the second syndrome code register (SPR) 12c.

If each of the second address register (APR) 10a, 10b, 10c has already captured an error address (EAD), the copy operations for the second address register (APR) 10a, 10b, 10c are not performed. Similarly, the copy operations for the second syndrome code register (SPR) 12a, 12b, 12c are not performed. Then, the control circuit (CCNT) 16 activates the address overflow signal (AOF) is determined to be an address overflow.

In case 1, the address captured in the first address register (ATR) 9 does not match any address of the second address registers (APR) 10a, 10b, 10c. That is, either of the address-compare signal (ACa,ACb,ACc) is an inactive indicating a mismatch. Therefore, the multi-bit error judgement circuit (MEJD) 15 inactivates the multi-bit error determination signal (MEJ). In addition, the control circuit (CCNT) 16 inactivates an address match signal (AMT) indicating whether the address of the first address register (ATR) 9 coincides with the address of any of the second address registers (APR) 10a, 10b, and 10c. Thus, the error flag mask circuit 17 activates the 1-bit error decision signal (1ED). Thus, the 1-bit error flag (1E) of the error flag register 18 is set. The interrupt control circuit (INTC) 36 also activates the interrupt signal (IRQ).

(1-2) Software Diagnosis

When a 1-bit error is detected for the first time in the data corresponding to the address given by CPU 1, that is, when a 1-bit error is detected, but the error address (EAD) stored in the first address register (ATR) 9 does not coincide with any of the addresses stored in the second address register (APR) 10a, 10b, and 10c, and an address overflow does not occur, the operation of CPU 1 will be described.

After detecting a 1-bit error, CPU 1 receives the interrupt signal (IRQ) and reads the error flag register 18. Thus, CPU 1 checks that the interrupt factor is a 1-bit error, and then diagnoses in the interrupt routine whether the detected 1-bit error is a true 1-bit error.

As described above, there is a case in which an odd-numbered bit error of 3 bits or more is recognized as a 1-bit error and data in the bit having no error may be corrected. The use of erroneously corrected data may lead to a safety violation, and if it is a multi-bit error, it is necessary to transition the device to a safety state.

Whether or not it is a true 1-bit error can be diagnosed by the software stored in the memory 2 by adding a checksum or data for cyclic redundancy check (CRC) to the data in the memory 2. The ECC is added to each word (e.g., 32-bit) unit and stored in the memory 2. On the other hand, the checksum or the CRC data, generally, is calculated from the data of the plurality of words and is stored in the memory 2 for each of the plurality of words so as not to increase the memory capacity. The data also contains the object code of the program.

Therefore, when diagnosing the data in which the 1-bit error is detected, CPU 1 reads out the data corresponding to address area in which the data of a plurality of words including the data in which the 1-bit error is detected is stored collectively. The data of the plurality of words is read out, error correction is performed using the corresponding ECC for each word. Then, CPU 1 calculates the checksum or the CRC data from the data of the plurality of words after the error correction, and compares it with the checksum or the CRC data stored in the memory 2. Incidentally, the checksum or the CRC data to be calculated from the read data of the plurality of words may be calculated by a dedicated arithmetic unit. Thus, it is possible to check that there is no error in the read data of the plurality of words after error correction, and it is possible to determine whether or not the 1-bit error correction has been corrected. That is, it can be checked that the detected 1-bit error is a true 1-bit error. Thus, since CPU 1 is used for diagnosing whether or not the detected 1-bit error is a true 1-bit error, load is applied to CPU 1 when 1-bit error is detected for the first time.

CPU 1 continues to operate using the error-corrected data if it is verified as a true 1-bit error by diagnostics. If CPU 1 determines that the error is not a true 1-bit error but a multi-bit error, it transitions the device 100 to a safety state. Even when an address overflow occurs, CPU 1 transitions the semiconductor device 100 to a safety state, for example.

The case where the address captured by the first address register (ATR) 9 matches the address captured by any one of the second address registers (APR) 10*a*, 10*b* and 10*c*, that is any one of the address comparison signals is active (AC=1), will be described. When data having a 1-bit error at the same address is read repeatedly, a bit error is detected at the second and subsequent reads.

The syndrome comparison circuits (SCM) 14*a*, 14*b*, and 14*c* compare the syndrome code (SYC) captured in the first syndrome code register (STR) 11 with the syndrome code (SYC) captured in the second syndrome code registers (SPR) 12*a*, 12*b*, and 12*c* (step S5).

When the syndrome code (SYC) captured by the first syndrome code register (STR) 11 matches the syndrome code captured by any one of the second syndrome code register (SPR) 12*a*, 12*b*, 12*c*, that is any one of the syndrome comparison signals is active (SC=1), the operation of the case 2 is performed thereafter.

(2) Case 2

In case 2, the error syndrome code (ESC) captured in the first syndrome code register (STR) 11 and the error syndrome code (ESC) captured in any one of the second syndrome code registers (SPR) 12*a*, 12*b*, and 12*c* (ESC) match. In other words, the read data corresponding to the syndrome code captured in the first syndrome code register (STR) 11 and the read data corresponding to the syndrome code (SYC) captured in any one of the second syndrome code register (SPR) 12*a*, 12*b*, and 12*c* match.

In case 2, a newly detected 1-bit error can be thought of as being similar to a previously detected 1-bit error. It has already been checked by software diagnosis in case 1 that the read data corresponding to the error syndrome code (ESC) stored in the second syndrome code register (SPR) 12*a*, 12*b*, or 12*c* is a true 1-bit error. Therefore, the software diagnosis for checking that the 1-bit error detected this time is a true 1-bit error becomes unnecessary.

Based on the address comparison signals (ACa, ACb, ACc), the control circuit (CCNT) 16 determines that the address captured in the first address register (ATR) has been stored in one of the second address registers (APR) 10*a*, 10*b*, 10*c*. Therefore, the control circuit (CCNT) 16 does not control to copy the error address (EAD) captured in the first address register (ATR) to the second address register (APR) 10*c*. In addition, the control circuit (CCNT) 16 does not control to copy the error syndrome code (ESC) captured by the first syndrome code register (STR) 11 to the second syndrome code register (SPR) 12*c*.

The multi-bit error judgement circuit (MEJD) 15 outputs a multi-bit error determination signal (MEJ) based on the syndrome comparison signals (SCa,SCb,SCc) which is a comparison result of the syndrome comparison circuits 14*a*, 14*b*, and 14*c* corresponding to the second address register (APR) whose address matches the address captured in the first address register (ATR) 9.

For example, when the address of the second address register (APR) 10*b* matches the address of the first address register (ATR) 9, the multi-bit error judgement circuit (MEJD) 15 outputs the multi-bit error determination circuit (MEJ) based on the syndrome comparison signal (SCb). When the syndrome code of the first syndrome code register (STR) 11 matches the syndrome code of the second syndrome code register (SPR) 12*b*, the multi-bit error judgement circuit (MEJD) 15 inactivates the multi-bit error determination signal (MEJ).

As described above, in the case 2, the error addresses (EAD) captured by any one of the second address register (APR) 10*a*, 10*b* and 10*c* match the error address (EAD) captured in the first address register (ATR) 9 as newly detected 1-bit error. Therefore, one of the address comparison signals ACa,ACb,ACc is activated.

Therefore, the control circuit (CCNT) 16 activates the address match signal (AMT) based on the address comparison signal (ACa,ACb,ACc). Thus, the error flag mask circuit 17 masks the 1-bit determination signal (1EJ) and the 1-bit error decision signal (1ED) becomes inactive. Consequently, the 1-bit error flag (1E) of the error flag register 18 is not set. The interrupt control circuit (INTC) 36 also inactivates the interrupt signal (IRQ). Thus, since the interrupt does not occur and the 1-bit error flag (1E) of the error flag register 18 is not set, CPU 1 does not perform unnecessary software diagnosis processing.

(3) Case 3

Although the address of the first address register (ATR) 9 matches address of any one of the second address registers (APR) 10*a*, 10*b*, 10*c*, if the first syndrome code of the syndrome code register (STR) 11 does not match any of the syndrome code of second syndrome code registers (SPR) 12*a*, 12*b*, 12*c*, that is SC=0, the operation of the subsequent case 3 is performed.

In case 3, it indicates that the error syndrome code (ESC) newly captured to the first syndrome code register (STR) 11 is inconsistent with any of the error syndrome code (ESC) captured to the second syndrome code registers (SPR) 12*a*, 12*b*, 12*c*. This means that the content of the bit error has changed, that is, the data having the 1-bit error has changed to the data having the multi-bit error (errors of 3 bits or more has occurred), and it can be considered that the multi-bit error has been judged as 1-bit error.

At this time, the control circuit (CCNT) 16 determines that the address newly captured in the first address register (ATR) has been stored in one of the second address registers (APR) 10*a*, 10*b*, 10*c* based on the address comparison signals (ACa, ACb, ACc), similarly to the case 2. Therefore, similarly to the case 2, the control circuit (CCNT) 16 does not control to copy the error address (EAD) newly captured in the first address register (ATR) to the second address register (APR) 10*c*. In addition, the control circuit (CCNT) 16 does not control to copy the error syndrome code (ESC) newly captured in the first syndrome code register (STR) 11 to the second syndrome code register (SPR) 12*c*.

However, since the error syndrome code (ESC) newly captured in the first syndrome code register (STR) 11 does not match any of the error syndrome codes (ESC) captured in the second syndrome registers (SPR) 12a, 12b, and 12c, any of the syndrome comparison signals (SCa,SCb,SCc) become inactive. Therefore, the multi-bit error judgement circuit 15 activates the multi-bit error determination signal (MEJ).

As described above, in case 3, the error address (EAD) newly captured in the first address register (ATR) 9 matches the error address (EAD) captured in any one of the second address registers (APR) 10a, 10b and 10c. Therefore, one of the address comparison signals (ACa,ACb,ACc) is activated.

Therefore, the control circuit (CCNT) 16 activates the address match signal (AMT). Thereby, the setting of the 1-bit error flag (1E) of the error flag register 18 based on the 1-bit error determination signal (1EJ) is masked by the error flag mask circuit 17. However, since the multi-bit error determination signal (MEJ) is active, the multi-bit error flag (ME) is set. In addition, since the multi-bit error determination signal (MEJ) is active, the interrupt control circuit (INTC) 36 activates the interrupt signal (IRQ) as a multi-bit error, and send the interrupt signal (IRQ) to CPU 1. Although the error correction operation is performed in the error correction circuit (SDEC) 8, data is not corrected correctly.

CPU 1 receives the interrupt signal (IRQ) and reads the error flag register 18 in the interrupt processing routine to check that a multi-bit error has been detected. After checking that a multi-bit error has been detected, CPU 1 shifts the semiconductor device 100 to a safety state.

(4) Case 4

When there is a 2-bit error in the data read from the memory 2, the error determination circuit (EJDG) 7 performs error determination operation based on the syndrome code (SYC) generated by the syndrome generation circuit (SYGN) 6 (step S2). The error determination circuit (EJDG) 7 detects a 2-bit error and activates the 2-bit error determination signal (2EJ) (2EJ=1). Thereafter, the operation of the case 4 is performed.

In case 4, the interrupt control circuit (INTC) 36 receives the 2-bit error determination signal (2EJ) and outputs the interrupt signal (IRQ) to CPU 1. CPU 1 reads the error flag register 18 in response to the interrupt signal (IRQ). Even if CPU 1 recognizes that the data includes a 2-bit error, the read data from the memory 2 is not corrected and the data is erroneous. Therefore, CPU 1 shifts the semiconductor device 100 to a safety state.

The retention failure of memory generally occurs on bit by bit. The bit failure accumulates and a 1-bit error to a 2-bit error, followed by a 3-bit error. In the present embodiment, when a 1-bit error transitions to a 2-bit error, it is detected by the 2-bit error detecting function of the error determination circuit (EJDG) 7. However, the error determination circuit (EJDG) 7 cannot detect a 3-bit error but may erroneously determine as a 1-bit error. In the present embodiment, when it is determined that there is a 1-bit error, it is possible to check whether or not it is a multi-bit error. The failure of memory includes not only bit failure, but also the failure of address decoder that cause sudden the multi-bit error. According to the present embodiment, these errors can be detected.

As described above, the semiconductor device according to the present embodiment includes an error detection and correction circuit having functions of 1-bit error correction and 2-bit error detection, and a multi-bit error detection circuit.

The multi-bit error detection circuit has the following functions.

(a) A function to capture an error address (EAD) to the first address register (ATR) in response to a 1-bit error determination signal, and at the same time, to capture an erroneous syndrome code (ESC) to the first syndrome code register (STR)

(b) A function to compare the address of the first address register (ATR) with the address of the second address register (APR), copy the value of the first address register (ATR) to the second address register (APR) as a new address if there is no matching in the second address register, and copy the value of the first syndrome register (STR) to the second syndrome register (SPR).

(c) A function to compare the address of the first address register (ATR) and the address of the second address register (APR), and if they match, compare the value of the first syndrome code register (STR) with the value of the second syndrome code register (SPR) corresponding to the second address register (APR) that matches.

(d) A function to mask the notification to CPU of the occurrence of a 1-bit error (correctable bit error), when, in (c), the values of the first and second synchronization registers (STR) and the second synchronization register (SPR) match.

(e) A function to output an interrupt as a multi-bit error when the values of the first and second syndrome registers do not match in (c), and to set the multi-bit error flag.

The semiconductor device according to the present embodiment has the function (d) described above, so that the interrupt operation due to the same 1-bit error of the same address, which has already been checked to be not a multi-bit error by the software diagnosis, can be prevented from repeatedly occurring. The software diagnosis of whether or not a true 1-bit error which is required each time a 1-bit error is detected is performed only when the 1-bit error is detected for the first time. Therefore, the load of CPU is reduced.

The semiconductor device according to the present embodiment has the function (e) described above, so that the CPU can recognize a multi-bit error. This makes it possible to transition the semiconductor device to a safety state.

When the 1-bit error is detected for the first time, it is checked whether or not it is a multi-bit error by software diagnosis, and when a 1-bit error is detected for the same address a second time or later, a multi-bit error can be reliably detected by the function of the present embodiment.

Further, the semiconductor device according to the present embodiment does not need to have two sets of ECCs as in Patent Document 1, and can reliably detect a multi-bit error, and does not cause a problem that the memory capacity by the second set of ECCs becomes large.

Second Embodiment

Figure 5:
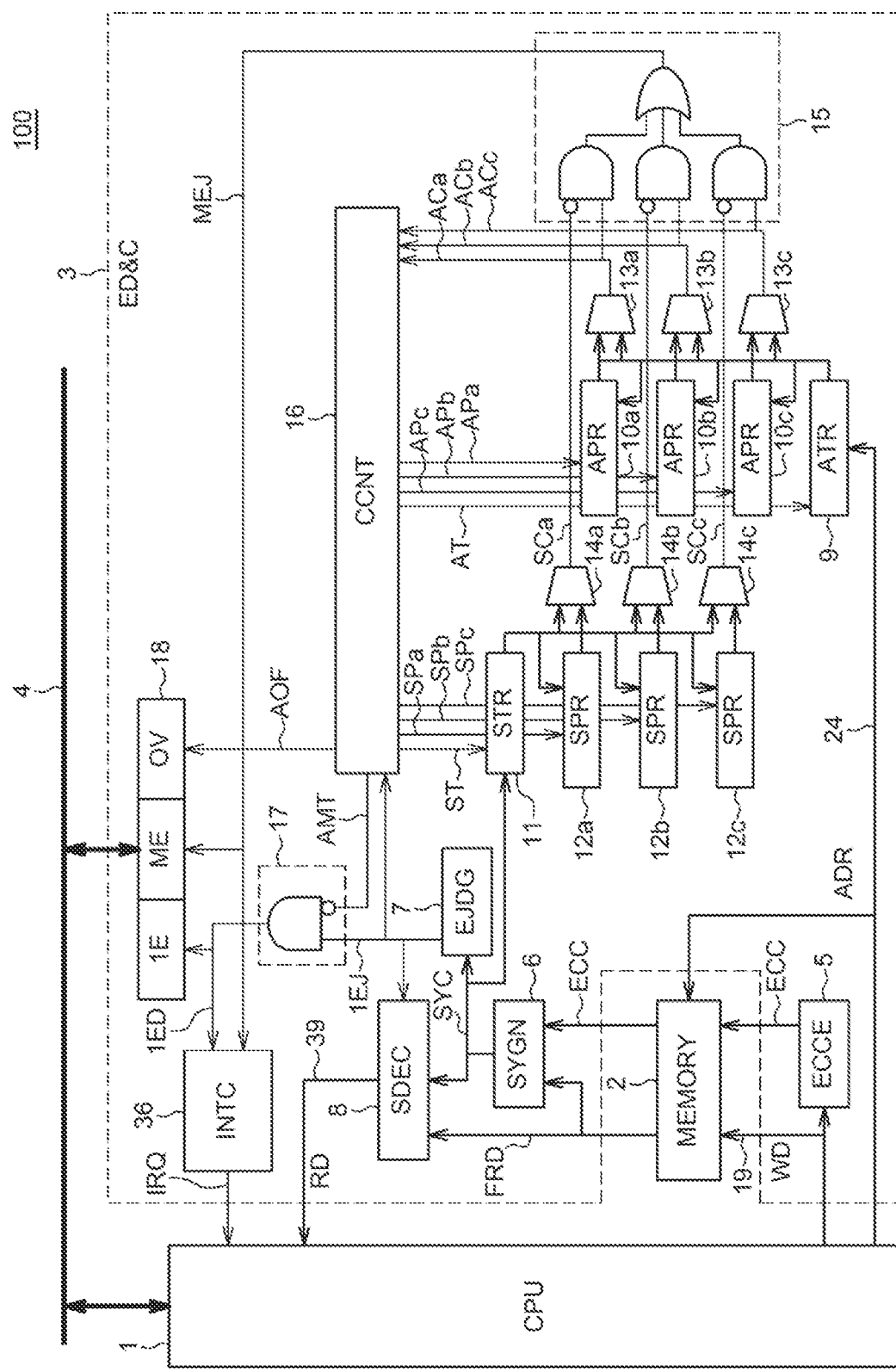
FIG. 5 is a block diagram showing a configuration example of a semiconductor device in the second embodiment.

FIG. 5 is a diagram showing a configuration example of a semiconductor device in the second embodiment.

The semiconductor device 100 according to the second embodiment differs from the first embodiment in that the error determination circuit (EJDG) 7 does not have 2-bit error determination function for the first embodiment, an interrupt is not generated based on 2-bit error, and the error flag register 18 does not include 2-bit error flag. Other configurations of the semiconductor device 100 in the second embodiment are the same as in the first embodiment.

The operation of the semiconductor device 100 in the second embodiment is the same as that of all the first embodiments except that 2-bit error is not detected.

Since the syndrome code (SYC) at the time of a 1-bit error and the syndrome code (SYC) at the time of a 2-bit error are different from each other, the multi-bit error determination signal (MEJ) can detect a 2-bit error. Therefore, the error determination circuit (EJDG) 7 does not necessarily need to have a 2-bit error function.

When the error determination circuit (EJDG) 7 has a 2-bit error detection function as the first embodiment, that is, the advantage of the first embodiment is that it is not necessary to perform software diagnosis even if a 2-bit error is not caused by accumulation of a 1-bit error and a retention failure of 2 bits rarely occurs at the same time. On the other hand, in the second embodiment, the 2-bit error is also determined as a 1-bit error, so that there is no distinction. Therefore, it is necessary to judge whether a true 1-bit error or a multi-bit error of two or more bits by software diagnosis at the time of first 1-bit error detection.

However, in the error detection and correction circuit (ED&C) 3 in the embodiment, since it is assumed that the software diagnosis is performed when the first 1-bit error is detected at a specific address, it is unnecessary to have the 2-bit error detection function as the first embodiment. That is, since the software diagnosis is performed when 1-bit error is detected at an address for the first time in the first and second embodiments, there is not much difference in the CPU load by the software diagnosis between the first and second embodiments.

On the other hand, in the case of a 2-bit error due to accumulation of retention failure, it is judged as a multi-bit error in the second embodiment, an interrupt occurs, and a multi-bit error flag is raised. Therefore, it is possible to transition the device to the safety state without any need for the software diagnosis after the occurrence of an error.

The number of bits of the ECC for 1-bit error correction and 2-bit error detection in the first embodiment is required to be 7 bits, for example, when the data width is 32 bits. In the present embodiment, since the two-bit error detection function of the first embodiment is not provided and 1-bit error correction is performed, the number of bits of the ECC can be set to 6 bits and 1 bit can be reduced. In other words, the memory capacity can be reduced by 2.56%.

As described above, the second embodiment indicates that it is not necessary to provide the 2-bit detection function of the first embodiment, so that the number of bits of the ECC can be reduced, so that the area of the memory cell array area of the memory 2 can be reduced. The larger the memory capacity, the greater the effect.

Third Embodiment

Figure 6:
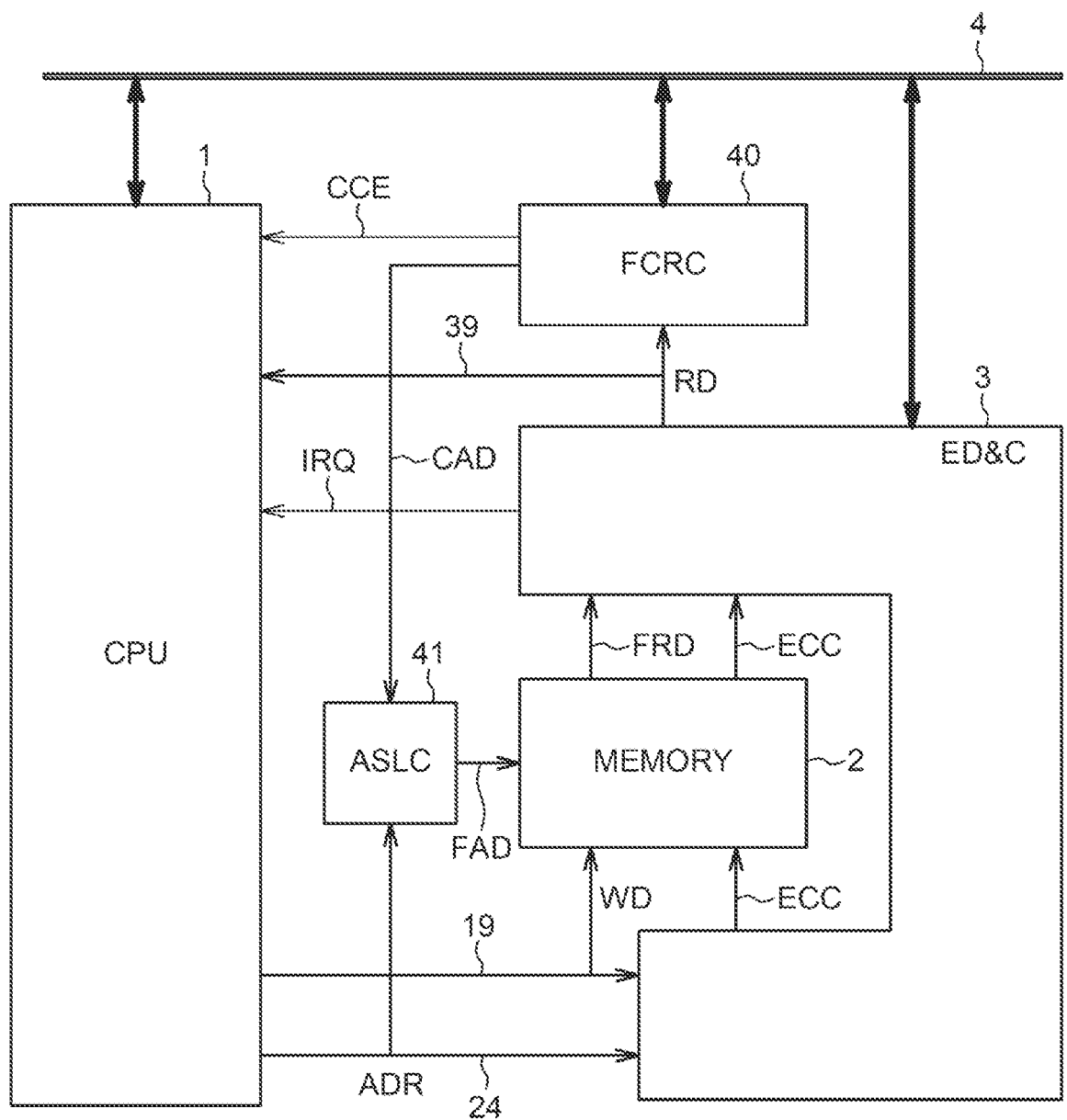
FIG. 6 is a block diagram showing a configuration example of a semiconductor device in the third embodiment.

FIG. 6 is a block diagram showing a configuration example of a semiconductor device in the third embodiment.

The third embodiment further includes a CRC calculation circuit (FCRC) 40 and an address selector (ASLC) 41, as compared with the second embodiment.

The CRC calculation circuit (FCRC) 40 is connected to CPU 1 through the internal bus 4. Then, the read data (RD) on the read bus 39 is inputted to the CRC calculation circuit (FCRC) 40. Then, the CRC calculation circuit (FCRC) 40 outputs a CRC diagnostic address (CAD) to the address selector (ASLC) 41, and outputs a CRC calculation completion signal (CCE) to CPU 1.

The address selector (ASLC) 41 receives the CRC diagnostic address (CAD) and an address (ADR) on the address bus 24. Then, the address selector (ASLC) 41 selects any one of the address (ADR) and the CRC diagnostic address (CAD), and outputs the address (FAD) to the memory 2.

Next, the operation of the semiconductor device in the third embodiment will be described.

In general, a semiconductor device is initialized by a reset and starts to operate by releasing the reset. It is strongly recommended that diagnostic tests of various circuits be carried out immediately after the reset release in semiconductor devices for functional safety.

For example, in the present embodiment, the CRC calculation circuit 40 which can diagnose the entire area of the memory 2 at high speed without using a CPU 1 is provided. After the reset release, the CRC calculation circuit 40 continuously reads the entire area of the memory 2 and performs a CRC calculation with a predetermined polynomial.

In the CRC diagnosis after the reset release, the address selector (ASLC) 41 selects the CRC diagnosis address (CAD) as the address (FAD) of the memory 2. Then, the CRC calculation circuit (FCRC) 40 automatically increments the addresses of all areas of the memory 2, reads data of all areas of the memory 2, and calculates CRC values. During CRC operation, data in the entire area of the memory 2 is read, but CPU 1 is set to halt state. The read data is ignored and CPU 1 does not operate. After the data reading of all the areas of the memory 2 is completed and the CRC values are calculated, the CRC calculation circuit (FCRC) 40 activates the CRC operation completion signal (CCE) and transmits the CRC calculation completion signal (CCE) to CPU 1.

CPU 1 receives the CRC calculation completion signal (CCE), transitions from the halt state to the normal state, and reads the calculation result from the CRC calculation circuit (FCRC) 40 via the internal bus 4. CPU 1 reads the CRC value stored in the memory 2 though the read data bus 39. CPU 1 compares the two CRC values read from the CRC calculation circuit (FCRC) 40 and the memory 2 to check that the data written in the memory 2 is correct.

The error detection and correction circuit (ED&C) 3 also functions when the entire area of the memory 2 is read by the CRC calculation circuit (FCRC) 40, and corrects the data when there is a 1-bit error. Therefore, in the case where the defect of the memory 2 is only a true 1-bit error, the error correction is correctly performed, and therefore, the CRC diagnosis result is a passing judgment. On the other hand, when there is an error of 2 bits or more, the error correction cannot be performed, so that the CRC diagnosis result is a rejection judgment. In addition, while the CRC diagnosis is being executed, the error detection and correction circuit (ED&C) 3 is functioning. Therefore, when there is a 1-bit error, the capture of the error address (EAD) and the capture of the error syndrome code (ESC) are executed as described in the first embodiment. It is possible to capture an error address (EAD) having true 1-bit error information in the entire area of the memory 2 to the second address register (APR) based on a result of the software diagnosis, and an error syndrome code (ESC) in that case to the second syndrome code register (SPR).

According to such a starting method, in a system in which the power supply of the semiconductor device is cut off, even if the error address (EAD) and the error syndrome code (ESC) captured once are not stored in the nonvolatile memory, they can be captured again every time the semiconductor device is started. This greatly reduces the probability that the first 1-bit error detection must be performed again during normal operation. This is because the error address (EAD) and the error syndrome code (ESC) captured as the 1-bit error before the power-off can be detected in the CRC diagnosis period after the next power-on. Therefore, by adding the CRC calculation circuit which checks the entire area of the memory 2, the CPU load due to the software diagnosis during the normal operation period can be further reduced.

In systems where there is a margin in the startup time after the power is shut off, CPU 1 may read instructions from the RAM (not shown) and perform the CRC diagnosis operation of the entire area of the memory 2 by software without providing a CRC calculation circuit configured by hardware. Here, the software for the diagnosis is read from the memory 2 and stored in the RAM f. Thus, it is possible to obtain the same effect as providing the CRC calculation circuit and it is not limited to the implementation of the CRC calculation circuit configured by hardware.

Although the disclosure made by the disclosing person has been specifically described based on the embodiments and examples, the present disclosure is not limited to the above-described embodiments and examples, and it is needless to say that various modifications can be made without departing from the gist thereof.

For example, in the embodiment, an example in which the three second address registers, the three second syndrome registers, the three address comparison circuits, and the three syndrome comparison circuits have been described, but at least one or more may be provided.

In the embodiment, the error detection and correction circuit for 1-bit error correction and 2-bit error detection have been described, but the present invention is not limited thereto and may be applied to error detection and correction circuits such as, for example, 1-bit and 2-bit error correction and 3-bit error detection.

What is claimed is:

1. A semiconductor device comprising:
a syndrome generation circuit configured to generate a syndrome code based on data and on an error correction code corresponding to the data;
an error determination circuit configured to detect a bit error in the data based on the syndrome code and to generate a 1-bit error detection signal based on a detection result; and
a multi-bit error detection circuit configured to determine whether the data having the bit error includes a multi-bit error by using an error address of the data having the bit error and an error syndrome code of the data having the bit error,
wherein the multi-bit error detection circuit includes:
a first address register capturing the error address in response to the 1-bit error detection signal;
a second address register storing a copy of the error address captured in the first address register;
a first syndrome code register capturing the error syndrome code in response to the 1-bit error detection signal;
a second syndrome code register storing a copy of the error syndrome code captured in the first syndrome code register;
an address comparison circuit comparing the error address of the first address register and the error address of the second address register;
a syndrome code comparison circuit comparing the syndrome code of the first syndrome code register and the syndrome code of the second syndrome code register; and
a control circuit configured to control the first and the second address register and the first and the second syndrome code register.

2. The semiconductor device according to claim 1, wherein the control circuit is configured to inform the detected bit error as a true 1-bit error when the error address of the first address register does not coincide with the error address of the second address register.

3. The semiconductor device according to claim 2, wherein, when the bit error detection signal is generated and the error address of the first address register does not coincides with the error address of the second address register, the control circuit is configured to control the first and the second address register to copy the error address captured in the first address register to the second address register and to control the first and the second syndrome code register to copy the error syndrome code captured in the first syndrome code register to the second syndrome code register.

4. The semiconductor device according to claim 1, wherein, when the bit error detection signal is generated, the error address of the first address register coincides with the error address of the second address register, and the error syndrome code of the first syndrome code register does not coincide with the error syndrome code of the second syndrome code register, the multi-bit error detection circuit is configured to determine that the bit error detection signal indicates the multi-bit error.

5. The semiconductor device according to claim 4, wherein the multi-bit error detection circuit is configured not to inform the detected bit error as the 1-bit error when the bit error detection signal indicates the multi-bit error.

6. The semiconductor device according to claim 1, wherein a number of the second address register is equal to that of the second syndrome code register, a number of the address comparison circuit is equal to that of the second address register, and a number of the syndrome code comparison circuit is equal to that of the second syndrome code register.

7. The semiconductor device according to claim 1, wherein, when the bit error detection signal is generated and the error address captured in the first address register does not coincide with the error address of the second address register, the control circuit is configured to inform the detected bit error as the 1-bit error.

8. The semiconductor device according to claim 1,
wherein the second address register includes a plurality of the second address registers,
wherein the second syndrome code register includes a plurality of the second syndrome code registers, and
wherein the control circuit is configured to control to copy the error address of the first address register to one of the second address registers which does not hold the error address and to copy the syndrome code of the first syndrome code register to the second syndrome code registers which does not hold the error syndrome code.

9. The semiconductor device according to claim 1, wherein the error correction code is a code for a 1-bit error correction and a 2-bit error detection.

10. The semiconductor device according to claim 1, wherein the error correction code is a code for a 1-bit error correction, but not for a 2-bit error detection.

11. A semiconductor device comprising:
a syndrome generation circuit configured to generate a syndrome code based on data and an error correction code corresponding to the data;
an error determination circuit configured to detect a 1-bit error of the data based on the syndrome code and to generate a 1-bit error detection signal based on a detection result, and
a multi-bit error detection circuit configured to determine whether the data detected to have 1-bit error includes a multi-bit error by using an error address of the data detected to have the 1-bit error and an error syndrome code of the data detected to have the 1-bit error;
a CPU;
a memory having the data and the error correction code corresponding to the data;
an error correction circuit configured to correct the data based on the bit error detection signal and the syndrome code; and
a CPU interface circuit configured to inform the 1-bit error or the multi-bit error to the CPU.

12. The semiconductor device according to claim 11, further comprising: a cyclic redundancy check calculation circuit configured to generate cyclic redundancy check data corresponding to data from the error correction circuit.

13. A semiconductor device comprising:
a CPU;
a memory;
a syndrome generation circuit configured to generate a syndrome code based on data read from the memory and an error correction code corresponding to the read data;
an error determination circuit configured to determine whether the read data has a 1-bit error based on the syndrome code,
an address register having an error address of error data which has been determined to have 1-bit error;
a syndrome code register having an error syndrome code of the error data; and
a multi-bit error detection circuit configured to send an interrupt request to the CPU for performing a diagnosis operation for checking the 1-bit error detected by the error determination circuit,
wherein, when the read data is determined to have 1-bit error by the error determination circuit, the multi-bit error detection circuit sends the interrupt request to the CPU when an address of the read data does not coincide with the error address or when a syndrome code of the read data does not coincide with the error syndrome code.

14. The semiconductor device according to claim 13, wherein the multi-bit error detection circuit does not send the interrupt request to the CPU when the address of the read data and the syndrome code of the read data coincide with the error address and the error syndrome code, respectively.

15. The semiconductor device according to claim 13, further comprising: an error flag register having a multi-bit error flag information indicating occurrence of multi-bit error,
wherein, even when the read data is determined to have 1-bit error, the multi-bit error detection circuit is configured to set the multi-bit error information when the syndrome code of the read data does not coincide with the error syndrome code and the address of the read data coincide with the error address.

* * * * *